United States Patent [19]

Hashimoto et al.

[11] 4,068,018

[45] Jan. 10, 1978

[54] PROCESS FOR PREPARING A MASK FOR USE IN MANUFACTURING A SEMICONDUCTOR DEVICE

[75] Inventors: Tadahiro Hashimoto; Yasushi Okuyama; Toshio Koguchi; Koji Wada; Mitsuru Sakamoto; Takayuki Yanagawa; Kyoji Yamamoto, all of Tokyo, Japan

[73] Assignee: Nippon Electric Co., Ltd., Tokyo, Japan

[21] Appl. No.: 613,427

[22] Filed: Sept. 15, 1975

[30] Foreign Application Priority Data

Sept. 19, 1974 Japan .................................. 49-108064
Oct. 5, 1974 Japan .................................. 49-115407
Feb. 26, 1975 Japan .................................. 50-23747
Mar. 20, 1975 Japan .................................. 50-34691
Mar. 26, 1975 Japan .................................. 50-37080
June 13, 1975 Japan .................................. 50-71754
June 13, 1975 Japan .................................. 50-71764

[51] Int. Cl.$^2$ .............................................. B05D 3/06
[52] U.S. Cl. .................................... 427/38; 96/38.3; 427/43

[58] Field of Search ................ 427/43, 38, 36, 41; 428/195, 210; 96/38.3

[56] References Cited

U.S. PATENT DOCUMENTS 3,467,523  9/1969  Seidel et al. .................... 96/115 P

OTHER PUBLICATIONS

Kleinfelder, "IBM Technical Disclosure Bull.," vol. 14, No. 10, Mar. 1972, p. 2899.

*Primary Examiner*—John H. Newsome
*Attorney, Agent, or Firm*—Hopgood, Calimafde, Kalil, Blaustein & Lieberman

[57] ABSTRACT

A process is disclosed for preparing a mask, such as a photo-mask, used in a selective etching process in the manufacture of a semiconductor device or a protective mask for use in a process for selectively providing a porous layer of silicon or for anodic oxidation of a metal layer, in which ions accelerated at a predetermined voltage are implanted into a photo-resist film to a predetermined dose level.

9 Claims, 54 Drawing Figures

PROCESS FOR PREPARING A MASK FOR USE IN MANUFACTURING A SEMICONDUCTOR DEVICE

BACKGROUND OF THE INVENTION

This invention relates generally to a process for preparing a mask used in the fabrication of semiconductor devices, and more particularly to a process for preparing a mask, such as a light-shielding mask for use as a photo-mask to be applied to the various photo-etching processes involved in the manufacture of a semiconductor device and a reaction-resistive mask for use as a protective mask for use in the anodic oxidation process and the porous silicon formation process in the manufacture of the semiconductor device.

Selective-exposure type photo-masks, which are widely used in a photo-etching process, include a dark portion, or a shielding portion, against ultraviolet rays and/or visible light, in a predetermined pattern. The known photo-masks include the emulsion type photo-mask using silver halogenide for the dark portion and the hard photo-mask using chromium metal, chromium oxide, cadmium sulfide, iron oxide, chalcogen glass and the like for the dark portion. However, the emulsion type photo-mask has a poor resolving power because of the large size of the silver particles and the large thickness (5 to 10 $\mu$m) of the emulsion layer, and also, has a short life because the emulsion layer is susceptible to damage when used in close contact with a wafer to be masked. The hard photo-mask has an improved resolving power because it employs a relatively thin (1000 to 5000Å) film of a metal or metal oxide for the dark portion, and has an increased mechanical strength and a life of 6 to 10 times greater than that of the emulsion type photo-mask. However, the hard photo-mask also does not have a sufficiently long useful life and its manufacturing cost is 8 to 10 times greater than that of the emulsion type photo-mask, so that the total cost of manufacture of a photo-mask for use in processing a semi-conductor substrate, in terms of the same number of wafers to be processed, is substantially the same as that of the emulsion type photo-mask. The hard photo-mask is particularly disadvantageous in that, in the case of a chromium photo-mask using a metal such as chromium for a dark portion, high optical-reflectance results. As a result, when the hard photo-mask is used for a close-contact exposure, the reflected light from a wafer is again reflected at the surface of the chromium causing multi-reflection, thereby impairing the reproducibility of the pattern to be transferred. In addition, with the other types of hard photo-masks described, the surface strengths of chalcogen glass and cadonium sulfide are inferior to that of the chromium photo-mask. On the other hand, the resistance of iron oxide against chemical is low in the event of an attack of a hot liquid of a photo-resist removing agent (for instance, J-100 made by Indust-Re Chem. Labo. Co., or OMR removing agent made by Tokyo Oka Kogyo Co., Tokyo, Japan, while chromium oxide is attacked by a mask cleaning liquid such as a hot concentrated sulfuric acid, hot nitric acid and the like. In addition, when cleaning is repeatedly applied to a chromium oxide photo-mask for repeated use, the optical density is lowered, thereby seriously impairing the function as a photo-mask. In addition, since either an evaporation process, a reactive sputtering process, or a chemical vapor deposition process is used in the manufacture of the hard photo-mask, strict control is required for the thickness of a film as well as for optical density.

In a widely used process for preparing an electrode wiring for a semi-conductor, particularly for an integrated circuit, a metal layer such as aluminum is subjected to selective etching, with a photo-resist film used as a protective mask. An example of the use of the photo-mask is the selective photo-etching of this aluminum layer in which the photo-mask is used to selectively expose the photo-resist film applied over the aluminum layer.

A process for preparing an electrode wiring according to selective anodic oxidation in place of the selective photo-etching has recently been proposed. In this process, an insulating film is selectively formed on a layer of an anodizable material such as aluminum, tantalum, or silicon and then the anodizable material layer is selectively converted into an oxide by anodic oxidation with the insulating film used as a protective mask against oxidation. Since a photo-resist film is used as the insulating protective film, the electrolyte tends to make ingress during the anodic oxidation into the side lower portion of the photo-resist film, because of poor adhesion between the photo-resist film and the anodizable material layer, with the result that an oxidized layer is formed even at a portion which is covered with the photo-resist film, thus resulting in a failure to prepare a desired electrode wiring pattern. In other words, the mere use of a photo-resist film will not insure satisfactory anodic oxidation for a long period of time, thus presenting a vital shortcoming for the anodic oxidation.

A selective preparation of a porous silicon layer, in which a silicon substrate is selectively converted into a porous layer according to the anodic reaction in a high concentration of hydrofluoric acid or like solution, has recently been proposed as a technique in manufacture of devices. In this selective conversion process, the silicon substrate is selectively covered with an insulating layer and then is subjected to an anodic reaction treatment with the insulating film used as a protective mask against the anodic reaction. As a material for the insulating protective film which must resist against a high concentration of hydrofluoric acid, a photo-resist, silicon oxide, silicon nitride, or alumina may be considered. However, materials other than alumina undergo a change in composition of a film or etching during the anodic reaction in hydrofluoric acid solution, so that those materials fail or retain their functions as protective masks for a long period of time. Moreover, an alumina film presents a poor contact with silicon, resulting in peeling of the film during the anodic reaction. Therefore, the alumina film is also unsatisfactory for use as a protective mask.

SUMMARY OF THE INVENTION

It is an object of the present invention to provide a mask for use as a photo-mask or a protective mask which is economical and stable physically and chemically.

It is another object of the present invention to provide a process for preparing a photo-mask which has high durability and is economical, and yet has a surface of a low reflecting capability as well as a high resolving power.

It is a further object of the invention to provide a novel protective mask for the selected anodic oxidation of an anodizable material.

It is still another object of the invention to provide a novel protective mask for the selective conversion of silicon into porous silicon.

It is a further object of the present invention to provide a process for manufacturing a semiconductor device which is economical and may be manufactured in a simplified manner, by using a protective mask.

According to the invention, an organic film having a thickness of 300A to 10 μm and made of an organic material selected from the group consisting of known photo-resist, polymethyl acrylate, rubber, novolak, polyethylene, polystyrene, and polyimide or of a combination thereof is formed on a substrate, and ions such as $^{31}P^+$, $^{11}B^+$, $^{20}Ne^+$, $^{40}Ar^+$, $^{49}BF_2$, $^{70}B_2O_3{}^+$, accelerated to a high energy level are implanted into the organic film at an acceleration voltage of, favorably over 50KeV to a dose level of, favorably over $10^{14}/cm^2$, so as to harden the organic film or carbonize part thereof, so that the resultant ion-implanted organic film shields ultraviolet rays and/or visible light and presents strong resistance to acid such as hydrochloric acid, sulfuric acid, hydrofluoric acid, aqua regia or the like. The organic film is patterned either before or after the ion-implantation. In other words, the organic film having a desired pattern may be formed on a substrate before ion-implantation, or the organic film may be selectively removed to form a desired pattern before or after the ion-implantation. The substrate on which the organic film is formed may be a plate of glass or other transparent material where a photo-mask is to be produced, a layer of aluminum or other anodizable material where a protective mask against anodic oxidation is to be produced, or a silicon body where a protective mask against selective anodic reaction is to be produced.

The thickness of the organic film should desirably range from 300A to 10 μm. In case the thickness of a film falls below this range, it will be difficult to obtain a desired optical density for a light shielding pattern of a photo-mask. On the other hand, if the thickness of a film exceeds this range, it will be difficult to obtain a desired optical resolving power. In case the resolving power is of no consequence, the thickness of the film may be increased. On the other hand, the thickness of the organic film to be used as a protective mask preferably falls in the mentioned range in order to obtain a desired mechanical strength of a film and a desired resistance.

In addition, if the acceleration voltage for ions is lower than 50 KeV, the ions will not reach the interior of the organic film, thereby failing to harden the organic film, completely. For this reason, the acceleration voltage should preferably be high, e.g. over 100 KeV. The higher the acceleration voltage, the stronger will be the durability of the ion-implanted organic film and the shorter will be the time required for such implantation of ions into the film. Moreover, a higher acceleration voltage reduces the dose level required. For instance, it takes about 20 minutes to implant $^{31}P^+$ ions into a photo-resist AZ-1350 (made by Shipley Company, Co. Inc. Newton, Mass, U.S.A.) having a thickness of 3500 to 4000A to a dose level of $10^{16}/cm^2$ at an acceleration voltage of 100 KeV. When an acceleration voltage of 400 KeV is used, then a similar implantation will be completed within 10 minutes or less.

This tendency of an acceleration voltage is expected to exist up to an acceleration voltage of about 1MeV. If a dose level is lower than $10^{14}/cm^2$, hardening of the ion-implanted organic film is difficult.

DESCRIPTION OF THE PREFERRED EMBODIMENTS

Figure 1A:
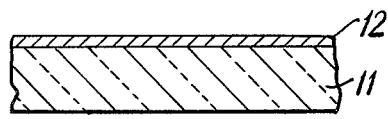
FIGS. 1 (A)-(D) are cross-sectional views illustrating the steps in a conventional process for preparing a photo-mask for use in photo-etching, FIGS. 2 (A) and (B) are cross-sectional views illustrating the steps of a process for preparing a photo-mask according to one embodiment of the invention.

According to a prior art process of making a photo-mask as illustrated in FIG. 1, a film 12 of a metal such as chromium or a metal oxide such as iron oxide is deposited to a thickness of 1000 to 5000A on the surface of a transparent glass substrate 11, as shown in FIG. 1(A). A pattern 13 of the photo-resist is prepared according to a conventional photo-process including the steps of coating, pre-baking, exposure, development, post baking and the like, as shown in FIG. 1(B). Then, as shown in FIG. 1(C), a film 12 of a metal or a metal oxide is selectively subjected to etching for removal, with the photo-resist 13 used as a protective film, against etching, in a suitable etching liquid. Finally, as shown in FIG. 1(D), the photo-resist is removed and a photo-mask is completed.

Figure 2A:
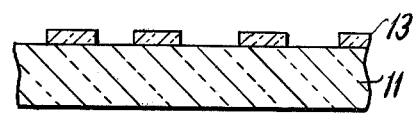
Figure 2B:
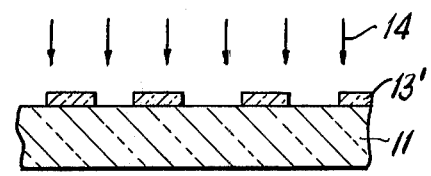

FIGS. 2(A) and (B) show the processes according to a first embodiment of the present invention. As shown in FIG. 2 (A), a photo-resist 13 having a desired pattern is formed on a transparent glass substrate 11 according to a conventional photo-process. The photo-resist used may be either one of commercially-available negative type and positive type photo-resists. This includes for instance, KMER (made by Eastman Kodak Co. Ltd., Rochester, N.Y., U.S.A) and WAYCOAT RESIST (made by Phillip A. Hunt Chemical Co. Palisades Park, N.J., U.S.A). In the case of a photo-resist of a positive type, AZ-1350 (made by Shipley Co. Inc., Newton, Mass., U.S.A) or OFPR (made by Tokyo OKa Kogyo Co., Tokyo, Japan) may be used. The thickness of the photo-resist film desirably ranges from 300A to 2 μm for improving the resolving power of the completed photo-mask. Subsequently, ions 14 such as $^{31}P^+$, $^{11}B^+$, $^{20}Ne^+$, $^{40}Ar^+$, accelerated at 100 KeV are implanted into the surface including the photo-resist film 13, as shown in FIG. 2 (B), thus completing the process for preparing a photo-mask according to the present invention. At this time, with an increase in the dose level of ions in the photo-resist film, the photo-resist film 13' is hardened accordingly, and the transmittance of light in the ultraviolet ray zone or visible light zone is reduced. In case the dose level exceeds $10^{15}/cm^2$, then the film 13' will not allow the light to transmit therethrough, and thus a photo-mask for use in photo-etching is provided.

Figure 3:
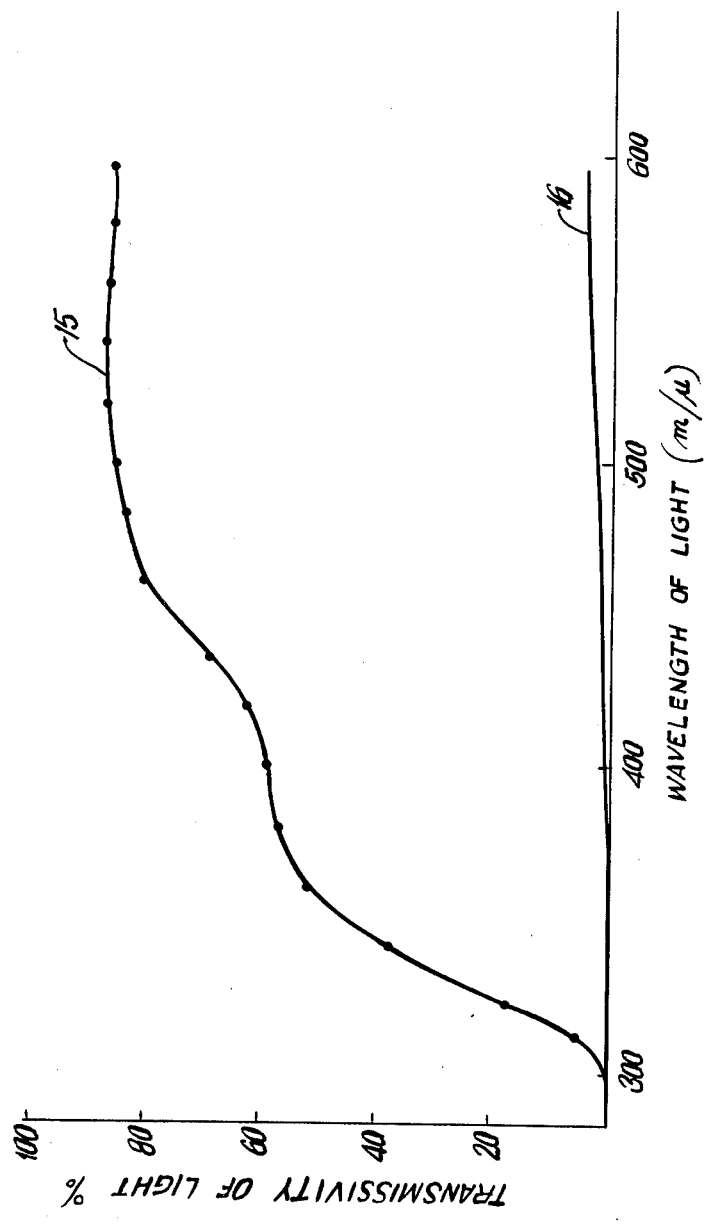
FIG. 3 is a plot showing the optical spectrum of a mask according to the present invention.

FIG. 3 shows the optical transmittance spectra of a photo-resist film before and after the implantation of ions, for a pusitine type photo-resist film (AZ-1350) having a thickness of about 4000A which is implanted with $^{31}P^+$ ions to a dose level of $10^{16}/cm^2$. In the drawing, the reference numeral 15 represents the optical transmission spectrum before the implantation of ions, and the reference numeral 16 represents the optical transmission spectrum after the implantation of ions. As shown, when a sufficient density of ions are implanted in the photo-resist film, the transmittance of the photo-resist film in the ultraviolet ray and visible light zones is considerably impaired. This phenomemon takes place in a photo-resist of either the positive type or negative type.

When a sufficient density of ions are implanted in a photo-resist film, then adhesion between the photo-resist film and the glass substrate is enhanced. At the same time a hardening reaction other than the hardening reaction due to light or heat takes place, so that the mechanical strength of the ion-implanted photo-resist film 13' is increased to a level equal to that of a metal, unlike a prior art photo-resist. In addition, when the photo-resist film 13' is implanted with ions of a sufficient density, the resistance of the film 13' to chemicals is also much improved, unlike a prior art photo-resist, and thus the ion-implanted photo-resist film 13' is able to resist hot sulfuric acid, hot nitric acid, photo-resist removing agent (for instance, OMR removing agent made by Tokyo OKa Kogyo Co. Tokyo, Japan) and the like, so that the ion-implanted photo-resist film 13' according to the present invention can be repeatedly cleaned in a cleaning chemical.

In the process for perparing a photo-resist for use in photo-etching, according to the present invention, ions are implanted in the photo-resist film, so that the film may be converted into a film having entirely different properties, as compared with the inherent properties of the photo-resist. In this sense, the present invention presents a significantly improved process which utilizes the ion-implanted photo-resist as a dark portion of the photo-mask. Moreover, the cost of a photo-mask may be lowered by the simplified and efficient process for preparing a photo-resist according to the present invention. In addition, the process of the invention avoids a removing step due to etching, which is required in the prior art preparation of a hard photo-mask, so that over-etching is prevented. As a result, the dimensional accuracy of an internal pattern of the photo-mask obtained according to the present invention may be much improved, as compared with that of a hard photo-mask made according to the prior art.

When the dose level of ions in a photo-resist at an acceleration voltage of over 50 KeV is increased, then the photo-resist film will be hardened, while part thereof will be carbonized, so that the transmittance of light in the ultraviolet ray and visible light zones will be considerably lowered. This tendency takes place when an organic film, such as polyethylene, methaacrylate, rubber, novalak resin, epoxy resin, polyethylene, polystyrene, polyimide or the like is used. Those organic films may be likewise used in place of the photo-resist film in the first embodiment of the present invention.

Figure 4A:
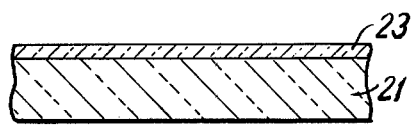
FIGS. 4 and 5 are cross sectional views illustrating the steps of processes for preparing a photo-mask for use in photo-etching, according to another embodiment of the present invention.
Figure 4B:
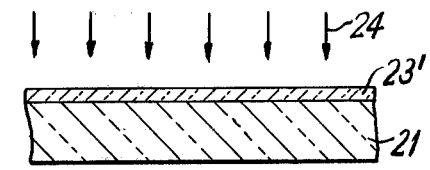
Figure 5:
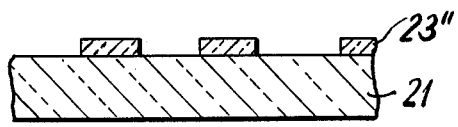

In the process illustrated in FIG. 4, a negative photo-resist film 23, such as one made essentially of 1,4cis.-polyisoprene rubber, is formed to a suitable thickness on the main surface, entire surface or entire effective surface used as a photo-mask of a transparent substrate 21 having a clean surface, as shown in FIG. 4(A). Ions are extracted from a plasma produced by a suitable ion source according to a suitable method, as shown in FIG. 4(B), and desired ions 24 are separated according to mass-separation and are then accelerated at an acceleration voltage of 130 KeV and implanted into the photo-resist film 23 to a dose level of $3 \times 10^{15}/cm^2$. The photo-resist film 23 is thereby converted into a hardened film 23', presenting a photo-mask substrate for use in photo-etching according to the present invention. For obtaining a photo-mask for use in photo-etching by using the photo-etching photo-mask substrate of FIG. 4(B), a known photo-etching process may be used, in which a photo-resist pattern (not shown) is prepared on the hardened ion-implanted film 23', and a portion of the ion-implanted film uncovered with the photo-resist pattern is removed. Thereafter the photo-resist pattern on the ion-implanted film 23' thus left unremoved is removed, completing the preparation of the photo-mask having a desired pattern 23" as shown in FIG. 5. The ion-implanted film thus hardened is not susceptible to etching in a ordinary chemical. However, the ion-implanted, hardened film 23' can be etched according to a known plasma etching or sputtering etching process. As in the first embodiment of the present invention, other types of organic films may also be effectively used in performing the process of FIG. 4

The embodiment of the invention illustrated in FIGS. 6 to 9 is particularly useful in case repair is required for a pattern of a master reticle or a metal mask. By this process repair may be readily applied to a desired pattern, improving the yield of the photo-masks and producing savings in the cost of fabrication. More particularly, in the process an organic film is formed in a predetermined pattern to a thickness of 300A to 10 μm on the main surface of a transparent glass substrate, on which a pattern layer adapted to shield ultraviolet rays and/or visible light has been formed. Particles accelerated to a high energy level are then implanted in the organic film to an extent that the film may act as a shield against ultraviolet rays and/or visible light, thus presenting a photo-etching photo-mask.

Figure 6:
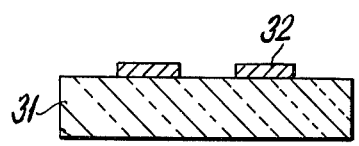
FIGS. 6 and 8 (A-E) are cross-sectional views illustrating the steps of a process of preparing a photo-mask for use in photo-etching according to a further embodiment of the invention.
Figure 7:
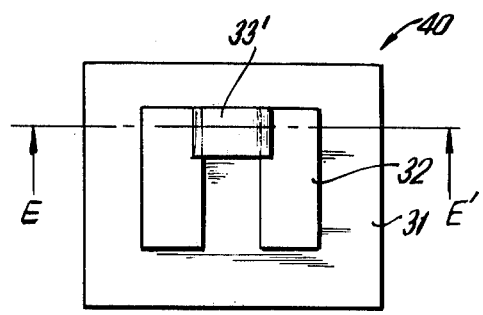
FIG. 7 is a plan view of the structure illustrated in FIG. 8 (E)
Figure 8A:
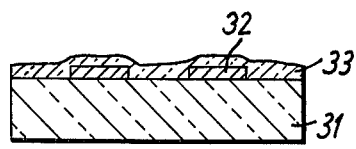
Figure 8B:
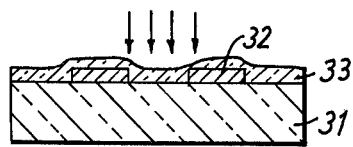
Figure 8C:
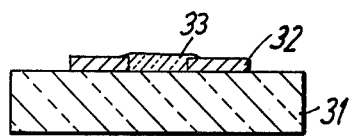
Figure 8D:
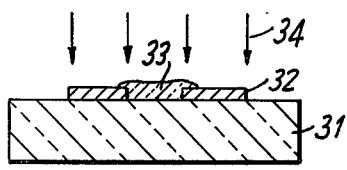
Figure 8E:
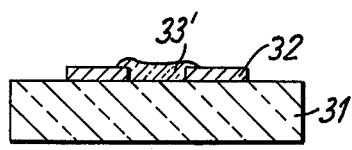
Figure 9:
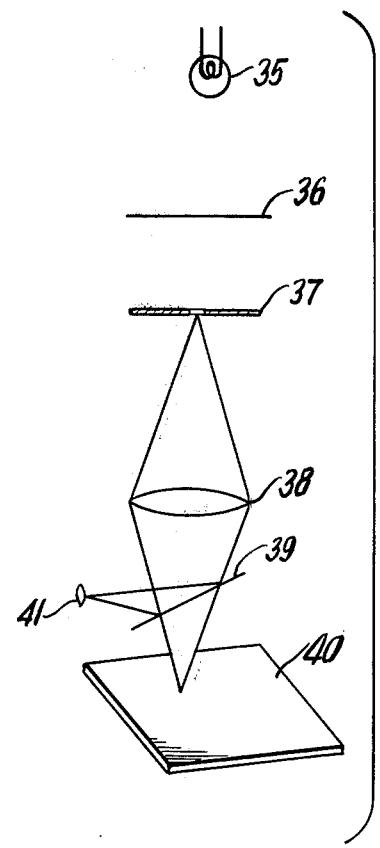
FIG. 9 is a schematic diagram illustrating equipment that may be used to expose the photo-resist film.

In the construction of the photo-mask for use in the selective-exposure of a photo-resist film in the manufacture of an integrated circuit that is to be repaired, as shown in FIG. 6, a thin layer 32 of metal or metal oxide such as chromium (Cr), chromium oxide ($Cr_2O_3$), nickel (Ni), copper (Cu), or iron oxide ($Fe_3O_2$), which layer corresponds to the pattern of the wiring or elements, is formed on the surface of a substrate 31 consisting of a transparent glass or the like. In most cases, several kinds of such photo-masks are provided as one set. In case repair is required for a pattern in which a pattern 33' is added to the layer 32, as shown in FIG. 7, then, as shown in FIG. 8(A), a negative type photo-resist film 33 is formed on the top surface of the transparent glass substrate 31, in a manner to cover the metal layer or metal oxide layer 32. The photo-resist which may be used for this purpose is that made of a negative type organic sensitive resin such as OMR83 or OSR (made by Tokyo Oka Kogyo Co., Tokyo, Japan) or KPR, KMER or KTFR (made by Eastman Kodak Co., Rochester, N.Y., U.S.A.). The thickness of the photo-resist film 33 preferably ranges from 300 A to several microns for achieving a satisfactory repaired pattern. Then, the photo-resist film 33 in the portion of a repaired pattern (at 33' in FIG. 7) is exposed by using an exposure means prepared beforehand, (FIG. 8(B)). This exposure means may consist, as shown in FIG. 9, of a light source 35 such as a mercury (Hg) lamp, a shutter 36 for shielding the light from the light source 35, a slit pattern 37 which may adjust the variable range of the light from the light source 35 to an extent corresponding to the desired magnification of a size of a repair pattern to be prepared on a photo-mask 40, a contracting lens 38 adapted to contract the radiating range defined by the slit pattern 37 for exposure on the photo-mask 40, and a half mirror 39 and a lens 41 for observing the exposure surface of the photo-mask 40 which may shift in a horizontal direction, as required. Accordingly, the position of the light being radiated relative to a photo-mask may be adjusted. The photo-resist film 33 which has been exposed to the light from the exposure means is subjected to development according to a known process, so that only the photo-resist 33 of a pattern to be repaired remains as shown in FIG. 8(C). Then, as shown in FIG. 8(D), ions are extracted from a plasma which may be prepared according to a suitable method by a suitable ion source, and desired ions are separated therefrom according to the mass separation process, after which the ions thus separated are implanted in the photo-resist film 33 to a dose level of $10^{15}/cm^2$ at an acceleration voltage of 130 KeV. FIG. 8(E) shows the ion-implanted photo-resist film 33' which now presents the characteristics of shielding ultraviolet rays and visible light, and the repair of an element pattern is thus completed as shown at 33' in FIG. 7.

In this embodiment, description has been given only of the case where a negative type photo-resist is used. However, the repair of a pattern may also be accomplished according to the present invention in the case of a positive photo-resist (for instance, AZ-1350, AZ-111 made by Shipley Co., Inc., Newton, Mass, U.S.A.). When the repair of a portion of a pattern does not require a high accuracy, an organic film such as a photo-resist, novolak, polyimide, may be formed simply by using a brush or the like, followed by ion-implantation, for the repair of a pattern addition. Although a description has been given of the use of positive ions, it is to be understood that either positive or negative may be used. In addition, particles which are maintained in an ionized condition at the time of acceleration and become neutral immediately before implantation may be used with the same result. Moreover, in place of the metal layer or metal oxide layer 32, an ion-implanted organic layer may be used.

Figure 1B:
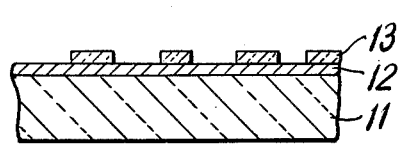
Figure 1C:
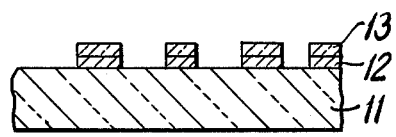
Figure 1D:
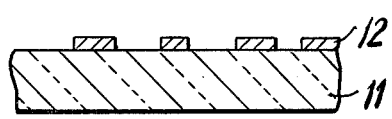
Figure 10A:
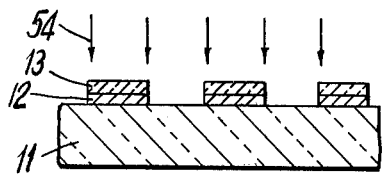
FIGS. 10A through 13E are cross-sectional views illustrating the steps of several processes for preparing photo-masks for use in photo-etching according to further embodiments of the present invention.
Figure 10B:
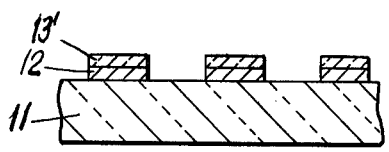
Figure 11A:
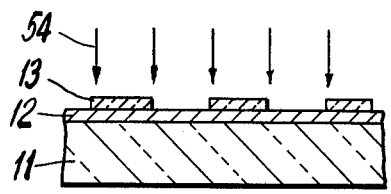

In the following description, of a fourth embodiment of the invention reference is made to FIGS. 10(A) and (B) and FIGS. 11(A) and (B) as well as to FIGS. 1(A), (B) and (C). As shown in FIG. 1(A), a film 12 of a material adapted to shield ultraviolet rays and/or visible light, such as chromium, chrominum oxide, iron oxide and the like is formed on the surface of a transparent glass substrate by an evaporation, sputtering or vapor plating process, to a thickness of 300 to 700 A. The film 12 may be provided in a single layer consisting of the aforesaid metal or one of metallic oxides, or may be of a multiple layer construction consisting of a combination of a metal and a metal oxide. On the other hand, a material for shielding ultraviolet ray and/or visible light may be of a metal or metal oxides described, or may be an organic film. As shown in FIG. 1(B), a photo-resist 13 of a desired pattern is formed on the film 12, and then the layer of film 12 thereunder is subjected to etching in a suitable etching solution, with the photo-resist film 13 used as a protective film to produce the structure as shown in FIG. 1(C). Then, as shown in FIG. 10(A), ions are extracted from a plasma generated by a suitable ion source according to a suitable process, and desired ions 54 are separated therefrom according to mass-separation, after which ions are implanted into the photo-resist film 13 to a dose level of $3 \times 10^{15}/cm^2$ at a voltage of 130 KeV. The photo-resist film 13 is thereby converted into the hardened film 13' as shown in FIG. 10(B), thus completing the process.

Figure 11B:
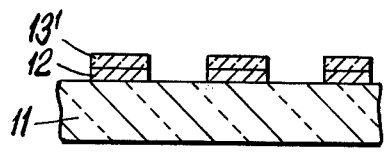

According to this embodiment, the metal or metal oxide layer 12 in the underlayer is subjected to etching, with the pattern of the photo-resist film 13 being used as a protective film, after which particles such as ions are implanted into the photo-resist film 13 to a suitable dose level. Alternatively, as shown in FIG. 11(A), particles such as ions may be implanted into the photo-resist film 13 to a desired dose level for hardening same before etching of the underlayer film 12, and then as shown in FIG. 11(B), the metal or metal oxide film 12 may be subjected to etching, while the ion-implanted photo-resist film 13' thus hardened is used as a protective film, with the same result obtained in the preceding case.

Figure 12:
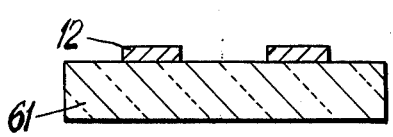

The fifth embodiment of the invention as illustrated in FIGS. 12 and 13, is directed to a process for providing with ease an inverted photo-mask having a performance that is equivalent to or better than that of a hard photo-mask, by using a hard photo-mask itself, rather than resorting to undesirable processes such as an inverted image processing, or reproduction of art work, and a master photo-mask.

Figure 13A:
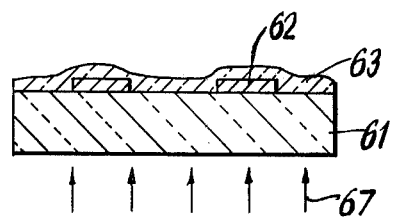
Figure 13B:
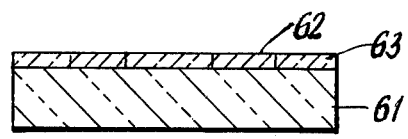
Figure 13C:
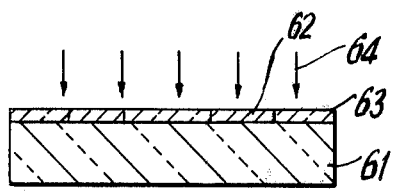
Figure 13D:
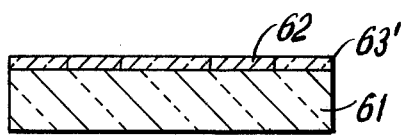
Figure 13E:
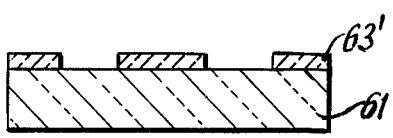

The photo-mask for use in the selective exposure of a negative type photo-resist, which is used in the manufacture of a semiconductor device, is of such an arrangement that, as shown in FIG. 12, a metal or metal oxide layer 62 of a small thickness, such as consisting of chromium (Cr), chromium oxide ($Cr_xO_y$), iron oxide ($Fe_mO_n$) or the like is formed in a predetermined pattern on a substrate 61 made, for example, of a transparent glass or the like. In most cases, several of such photo-masks are provided as a single set. For providing an inverted photo-mask for use in the selective exposure of a positive-type photo-resist, as shown in FIG. 13(E), relative to the photo-mask for use in a negative type photo-resist, as shown in FIG. 12, a negative type photo-resist film 63 is first applied, as shown in FIG. 13(A), on the entire surface of the transparent glass substrate 61 in a manner to cover the negative pattern of the metal or metal oxide layer 62. As a photo-resist, OSR, OMR 83, KPR, KMER, KTFR, or Way coat Resist mentioned above, or, any negative type organic sensitive resin may be used herein. Subsequently, an entire surface exposure 67 is applied to a photo-mask having a photo-resist film 63, from the back side of a transparent substrate, as shown in FIG. 13(A), followed by a developing treatment according to a known process, so that there remains a photo-resist film 63 in the portions other than the pattern 62 of the photo-mask, as shown in FIG. 13(B). Then, as shown in FIG. 13(C), ions 64 are extracted from a plasma generated by a suitable ion source according to a suitable process, so that desired ions are separated according to mass-separation, after which the ions thus separated are implanted into the photo-resist film 63 at an acceleration voltage of 150 KeV to a dose level of $10^{16}/cm^2$. In this respect, included by the ions which may be used herein are ions such as $^{31}P+$, $^{11}B+$, $^{20}Ne+$, $^{40}Ar+$ and the like, and ions consisting of a plurality of atoms such as $^{49}BF_2+$, $^{70}B_2O_3+$ and the like. The ions should not necessarily be subjected to mass separation, but whole ions generated from the ion source may be implanted directly; the larger the mass of the ions, the more desirable. There is no trouble in implanting ions in the surface of the hard photo-mask 62 using a film of chromium (Cr), chromium oxide ($Cr_xO_y$), iron oxide ($Fe_mO_n$), or the like for the dark portion. The implantation of ions converts the photo-resist film 63 into a hardened film 63' which shields ultraviolet rays and/or visible light, as shown in FIG. 13(D). Furthermore, the metal or metal oxide layer 62 of the negative pattern on the surface of the transparent substrate 61 is removed by using a suitable etching liquid, and thereby an inverted, or positive, photo-mask 63' is obtained, as shown in FIG. 13(E). The process of the fifth embodiment of the invention may be applied to any of a master reticle, master photo-mask, sub-master photo-mask, working photo-mask and the like as used in the manufacture of a photo-mask.

In the sixth and seventh embodiments of the invention, illustrated in FIGS. 15 and 16, a mask according to the present invention is used as a protective mask in a chemical treatment in the manufacture of a semi-conductor device.

FIG. 14 shows the steps of a conventional process for preparing wiring layers. As shown in FIG. 14(A), a window for an electrode contact to a silicon substrate 71 is formed in an oxide film 72 covering the silicon substrate 71. Then, as shown in FIG. 14(B), an anodizable material film 73, such as of aluminum, is formed over the oxide file 72 with a window to a thickness of 1 to 2 μm by evaporation or sputtering. Then, as shown in FIG. 14(C), the surface portion of the aluminum film 73 is subjected to anodic oxidation for converting same into a porous alumina film 74. This step renders the photo-resist film 75 resistable to the anodic oxidation which is carried out at a high voltage in the subsequent step. In this step, the electrolyte used should principally etch alumina to some extent, and may include, for instance, aqueous solutions of chromic acid, oxalic acid, phosphoric acid, sulfuric acid or the like. The anodic oxidation is carried out at a voltage of 1 to 30 V at a current density of 0.1 to 10 $mA/cm^2$, so that a porous alumina film 74 may grow to an extent in proportion to the duration of the anodic oxidation. Then, as shown in FIG. 14(D), a pattern of a photo-resist 75 is formed according to an ordinary process, and the surface which is not covered with the photo-resist 75 is subjected to selective anodic oxidation, thereby converting the aforesaid surface into a non-porous alumina 76. (FIG. 14(E)). The electrolyte as used in this step should be such as not to etch alumina, for instance, a solution, in which ethylene glycol is saturated with ammonium borate. Thus, there may be formed a non-porous alumina 76 in amounts proportional to the voltage used.

Figure 14A:
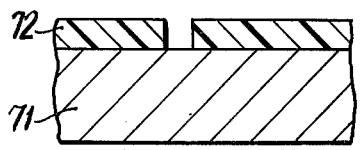
FIG. 14 (A-G) is a cross sectional view illustrating the steps of a conventional process for preparing a wiring layer.
Figure 14B:
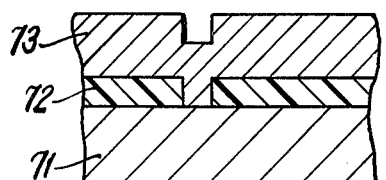
Figure 14C:
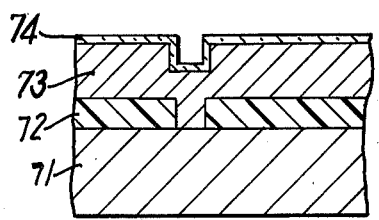
Figure 14D:
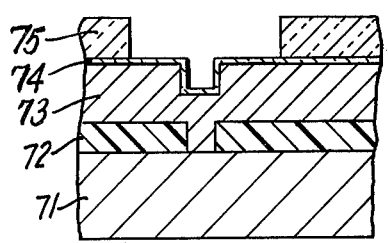
Figure 14E:
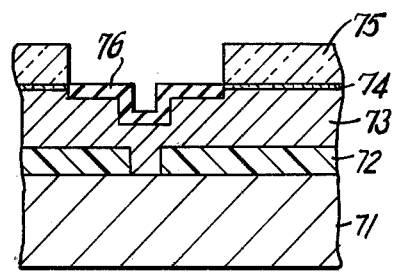
Figure 14F:
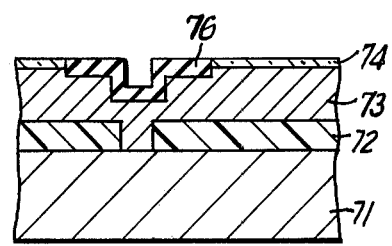
Figure 14G:
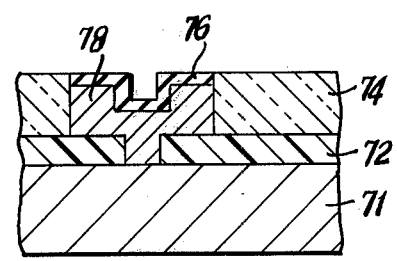

Then, as shown in FIG. 14(F), the photo-resist film 75 is removed, and then the substrate is subjected to anodic oxidation, with the non-porous alumina 76 used as a protective film, so that the aluminum film 73 in the area which is not covered with non-porous alumina 76 is converted into the porous alumina 74 to an extent to reach the oxide film 72 lying thereunder (FIG. 14(G)), thus shaping the predetermined pattern of an electrode wiring. In this step, the electrolyte should be an aqueous solution such as phosphoric acid, sulfuric acid, or oxalic acid, and the anodic oxidation is carried out at a voltage of 1 to 30 V at a current density of 0.1 to 10 $mA/cm^2$. This anodic oxidation progresses in proportion to the duration thereof, and the portion oxidized become transparent.

Finally, an alloying treatment for the aluminum film 73 and the silicon substrate 71 is carried out at a suitable temperature, and then the covering non-porous alumina 76 at a bonding pad portion is subjected to etching, with a photo-resist film (not shown) used as protective film, with the result of partial exposure of the aluminum surface at the bonding portion, thus completing the process.

As is apparent from the foregoing, the prior art process requires excessive steps of preparing protective films 75 and 76 for conversion in the porous alumina film 74, with the resulting complicated process, because the photo-resist film 75 cannot be used as a direct protective film during the anodic oxidation to convert the entire thickness of the aluminum layer into the porous alumina film 74. The process according to the present invention which uses a mask of the invention, dispenses with such a complicated process, but may provide an electrode wiring produced by selective anodic oxidation in a simple manner.

Figure 15A:
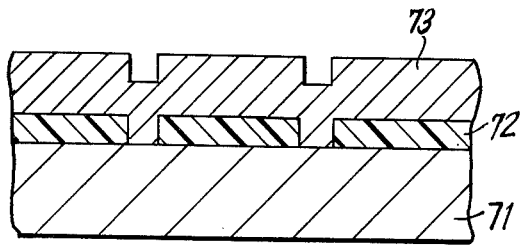
FIG. 15A through FIG. 16E are cross-sectional views illustrating the steps of processes for preparing wiring layers according to the present invention.

More particularly, in the embodiment of the invention, illustrated in FIG. 15, windows for electrode contacts are provided in an oxide film 72 covering a silicon substrate 71, and an aluminum film 73 is formed thereon to a thickness of 1 to 2 μm by evaporation or sputtering, as shown in FIG. 15(A). Thereafter, as shown in FIG. 15(B), a pattern of a photo-resist 75 is formed directly on the aluminum film 73 to a thickness of 3 μm according to a known process. Then, as shown in FIG. 15(C), ions 77 such as $^{11}B+$, $^{20}Ne+$, $^{31}P+$, $^{40}Ar+$ accelerated at a voltage of 80 KeV are implanted into the entire surface of the substrate, including the photoresist film 75. At this time, in case the amount of ions implanted into the photo-resist film 75 is increased to a dose level of $10^{14}/cm^2$, the contact between the aluminum film 73 and the ion-implanted photo-resist film 75' is much improved. In this embodiment, $^{31}P+$ is implanted at a dose level exceeding $10^{16}/cm^2$ to harden the photo-resist film 75 so that the contact between the ion-implanted photo-resist film 75' and the aluminum film 73 is much improved, thereby avoiding the possibility of the hardened photo-resist film 75' being peeled during anodic oxidation, or losing its shape partially, thus providing a resistance to the anodic oxidation at a high voltage level for a long period of time. Then, the exposed portion of the aluminum film 73 is converted into porous alumina 74 by anodic oxidation as shown in FIG. 15(D), with the ion-implanted photo-resist film 75' used as a protective mask against anodic oxidation. In this anodic oxidation, the same electrolyte and the same conditions of anodic oxidation as those of the process described with reference to FIG. 14 are employed. Then, the ion-implanted photo-resist film 75' is removed, (FIG. 15(E)), thus completing the process of shaping the desired pattern of electrode wiring. Then, as shown in FIG. 15(F), another photo-resist film is selectively formed on a portion 73' of the aluminum layer which corresponds to a bonding pad portion, according to an ordinary process, and then ions 78 are implanted in the entire surface of the substrate including the photo-resist film. Then, as shown in FIG. 15(G), the substrate is subjected to anodic oxidation again, while the ion-implanted photo-resist film 77' is used as a protective mask, so that the surface of the aluminum layer other than the bonding pad portion is converted into a non-porous alumina film 76, and thus the surface of the aluminum wiring portion is covered with non-porous alumina. At this time, the non-porous alumina film 76 is produced in proportion to a voltage level in the anodic oxidation. In the case of 100-volt anodic oxidation, the non-porous alumina is formed to a thickness of about 1300 A. In addition, the electrolyte used in this anodic oxidation may be of the type described earlier. The photo-resist film 77' which has been subjected to ion-implanting treatment can well resist an anodic-oxidation voltage of 100 volts, while an ordinary photo-resist film which has not been subjected to the ion-implanting treatment may withstand voltages of only up to 60 to 70 volts. According to the process of the present invention, a non-porous alumina film 76 having a thickness of over 1000 A can be formed on portions other than the bonding pad portions 73', i.e., the surface of the aluminum film 73 in the aluminum wiring portion, so that the effective protection of the wiring portion of the aluminum film 73 may result. Then, as shown in FIG. 15(H), the ion-implanted photo-resist film 77' is removed according to an etching process using oxygen plasma or nitrogen plasma, followed by an alloying treatment for the aluminum film 73 and silicon substrate 71 at a suitable temperature, thus completing the process. As is clear from the foregoing, the process according to the present invention is much simplified and is comparable to an electrode wiring process according to an etching process, unlike the prior art electrode-wiring forming process according to selective anodic oxidation. Yet furthermore, as has been described earlier, the bonding pad portion is devoid of over-etching, due to the formation of a local battery, color change of the surface of aluminum and the like, because the surface of aluminum is not exposed due to etching as in the prior art process.

Figure 15E:
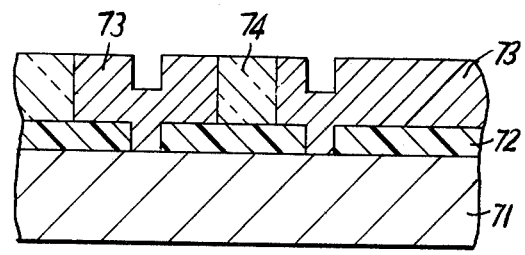
Figure 15B:
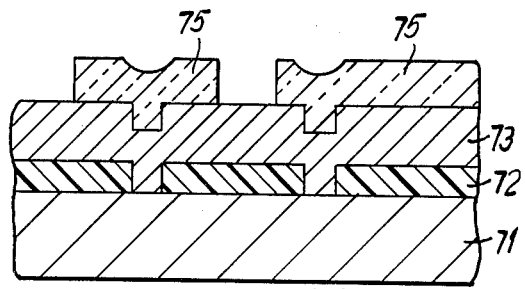
Figure 15F:
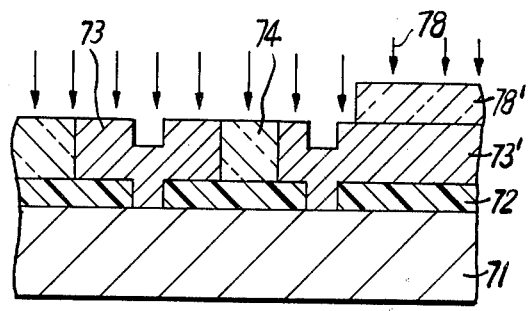
Figure 15C:
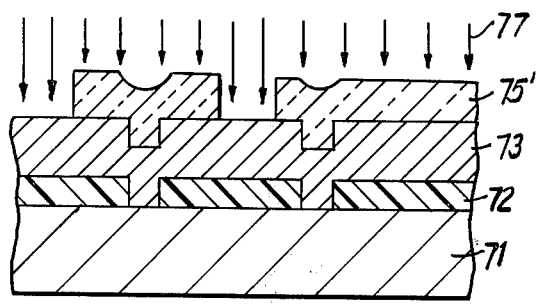
Figure 15G:
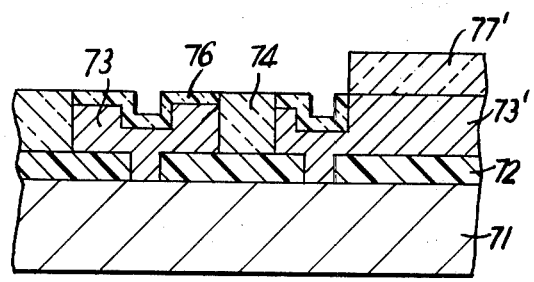
Figure 15D:
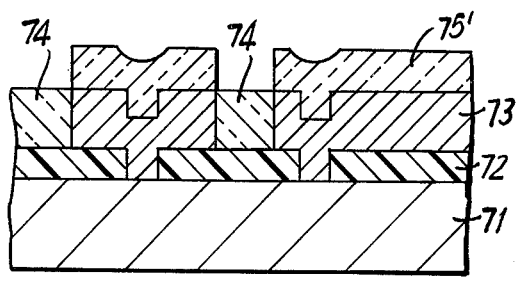
Figure 15H:
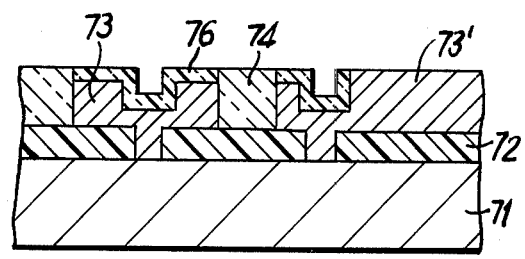
Figure 16A:
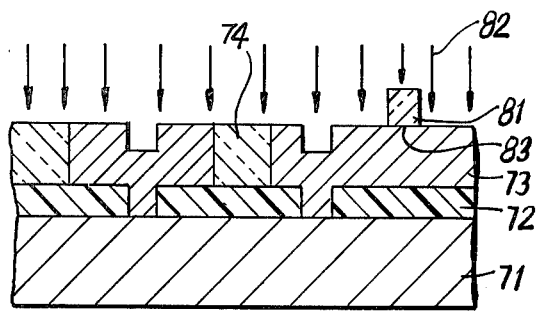
Figure 16B:
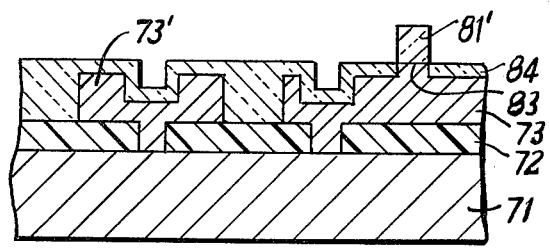
Figure 16C:
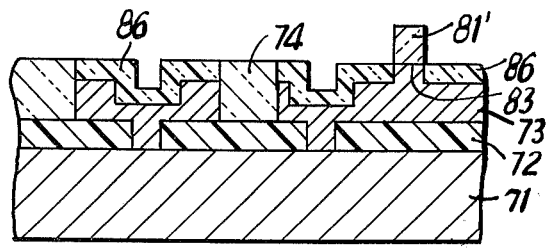
Figure 16D:
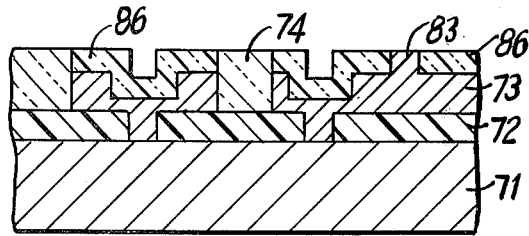
Figure 16E:
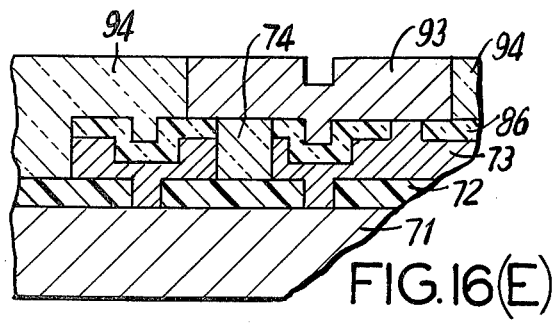
Figure 17A:
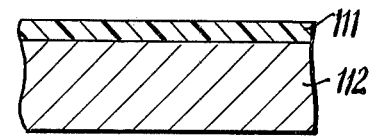
FIG. 17 (A-D) is a cross-sectional view illustrating the process for preparing a mask according to the present invention.
Figure 17B:
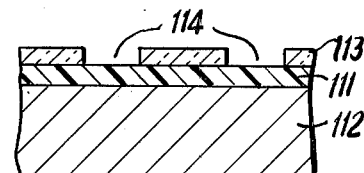
Figure 17C:
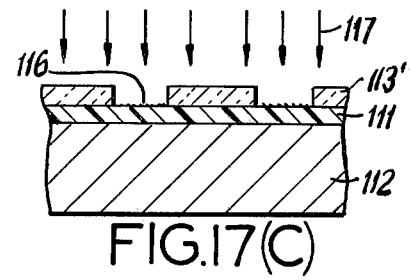
Figure 17D:
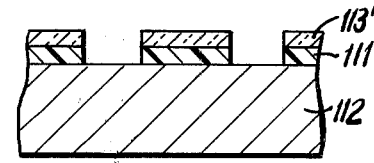

In the embodiment of the invention, as illustrated in FIG. 16, the process according to the present invention is applied to a multi-layer wiring. More specifically, after the completion of forming an electrode wiring as shown in FIG. 15(E), a photo-resist film 81 is selectively applied to a portion, i.e., a so-called through-hole portion 83 interconnecting the aluminum wiring layer 73 and an overlaying wiring layer described below, of the aluminum layer 73, after which ions 82 are implanted into the entire surface of the substrate, including the photo-resist film 81. Then, as shown in FIG. 16(B), anodic oxidation is carried out by using the ion-implanted photo-resist film 81' as a protective mask thereby forming a porous alumina film 84 to somewhat increased thickness at the exposed surface portion of the aluminum wiring layer 73. Subsequently, as shown in FIG. 16(C), a nonporous alumina film 86 is formed on the aluminum wiring layer 73 other than at the through hole portions 83, with an electrolyte exchanged and by again using the ion-implanted photo-resist film 81' as a protective mask. This alumina film 86 with an increased thickness has a desired hardness and yet presents an excellent insulating property. According to the prior art process, the photo-resist film fails to resist two cycles of anodic oxidations, but the ion-implanted photo-resist film 81' does resist them. Then, as shown in FIG. 16(D), the ion-implanted photo-resist film 81' is removed. Thereafter, aluminum evaporation is again carried out to deposit a second aluminum layer, which is in turn used to form the second wiring layer, i.e., the wiring pattern in the second layer. This formation of the wiring in the second layer can be performed by the ordinary etching process or by the selective anodic oxidation process. FIG. 16(E) shows an example of a wiring layer 93 in the second layer, which is formed according to selective anodic oxidation again by converting the undesired portion of the second aluminum layer into aluminum 94. After the completion of the formation of the wiring 93 in the second layer, then as shown in the embodiment of FIG. 15, a non-porous alumina (not shown) is formed on the surface of a wiring portion 93 excluding the bonding pad portion, for protecting the wiring.

While the description of the process has been given thus far with reference to the use of $^{31}P^+$ ions, other ions such as $^{11}B^+$, $^{20}N^+$, $^{40}Ar^+$, $^{75}As^+$ may be used instead. In addition, other anodizable materials which are adapted for use in anodic oxidation may be used instead of or in addition to aluminum, such as tantalum, molybdenum, silicon, hafnium, alloys thereof such as aluminum-silicon alloy, and laminated layers such as tantalum-aluminum, silicon-aluminum and the like. Moreover, instead of the semiconductor substrate 71, an insulating substrate or a wiring substrate having a desired portion covered with an insulating film may be used as a substrate in the process of the present invention. In addition, the process according to the present invention may be applied to the formation of not only a wiring but also a thin film resistor of tantalum or other electric element. Yet furthermore, instead of a photo-resist used as an organic film, other organic films may be used.

The embodiments of the invention illustrated in FIGS. 17 and 18 are particulrly directed to providing a protective mask which is effective in selectively preparing a porous layer of silicon in a high concentration of a hydrofluoric acid solution. For this reason, an organic film such as of a photo-resist is not directly formed on a silicon wafer, but a silicon nitride film or silicon oxide-silicon nitride double film is formed or accumulated on the silicon wafer beforehand, and then an organic film such as a photo-resist or polyimide is formed on the silicon nitride film, after which ions are implanted into the surface of the organic film to thereby harden the organic film. Thus, the present invention provides a protective mask of a double or triple layer construction consisting of the silicon nitride film and the ion-implanted organic film or the silicon oxide film and the mentioned two films. According to such double or triple layer construction, ions may be implanted into the entire surface of the organic film without implanting a silicon surface with ions. The ion-implantation increases the acid-resistance of the organic film. In case a protective mask of such a double construction is used, side etching takes place in the edges of a pattern of an opening for exposure in a silicon nitride film positioned under the ion-implanted organic film in a high concentration of hydrofluoric acid solution. However, such side etching may be suppressed to a degree allowable in the manufacture of a semiconductor device. In addition, when a silicon nitride film under the ion-implanted photo-resist or the ion-implanted organic film such as of polyimide is selectively etched for providing an opening for exposure, the ion-implanted film can be utilized as a protective mask against etching.

The embodiment of FIG. 17 is illustrative of the procedures for forming a protective mask according to the present invention. As therein shown, a silicon nitride film 111 is formed on a surface 112 of a wafer of an N type of a P type silicon or of an epitaxial silicon wafer having an N type epitaxial layer on an N or P type substrate or a P type epitaxial layer on an N or P type substrate, according to a chemical vapor deposition process at a temperature of 700° to 1100° C to a film thickness of 300 to 800 A, as shown in FIG. 17(A). Then, an organic film 113 of a known photo-resist or polyimide is formed to a thickness of 300 A to 10 μm on the silicon nitride film 111, after which openings 114 are prepared therein according to a known photo-etching process, as shown in FIG. 17(B). Thereafter, heat treatment is applied to the organic film 113 for hardening same to some degree. For instance, heat treatment is carried out at at a temperature of 160° C for a period of between 10 minutes and one hour for a photo-resist film 113, or at a temperature of 200° to 500° C for a period of 10 to 30 minutes for a polyimide film 113. Then, ions 117 are implanted into the surface of the organic film 113 and the exposed surface 116 of the silicon nitride film 111, as shown in FIG. 17(C). The photo-resist or polyimide film 113 is hardened to a high degree, while part thereof is carbonized, thereby providing a film 113' which is resistant to acid, and the adhesion between the film 113' and the silicon nitride film 111 thereunder is improved, resulting in an increase in mechanical strength. In this respect, ions to be implanted may be P+, Ar$^{30}$, B+ and the like. However, ions having a large mass are desirable. For instance, when Ar+ ions are implanted in photo-resist film 113 having a thickness of 4000 A, the implanting energy should be over 50 KeV and the dose level of ions should be over $10^{14}$ atoms/cm$^2$, respectively. The higher the values of the energy and the dose level, the higher is the acid-resistance of the ion-implanted film 113'. Then, the exposed portion 116 of the silicon nitride film 111 is subjected to etching in a hydrofluoric acid solution, with the ion-implanted film 113' having high acid-resistance being used as a protective mask. In this etching, the silicon nitride film having a thickness of 4000 A is etched for 8 minutes in the 49% hydro-fluoric acid solution at a temperature of 17° C. The etching rate of the silicon nitride film which has not been implanted with ions is 200 A/min under the same condition as that of the preceding case. In contrast to this, in case ions are implanted, the silicon nitride film is etched for a duration 2/5 times as short as that of the aforesaid etching rate. After the silicon nitride 111 film has been selectively etched, the ion-implanated film 113' may be readily removed in an oxygen atmosphere at a high temperature.

Before going into a description of the process illustrated in FIG. 18, it should be noted that the conductivity type of silicon in this embodiment may be changed from P type to N type or from N type to P type with the same result.

Figure 18A:
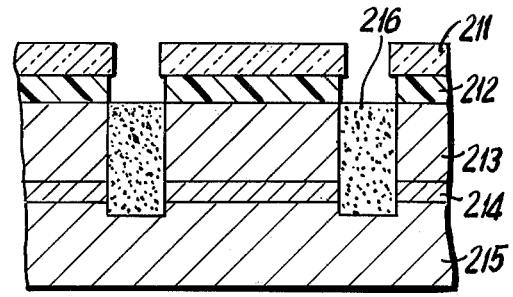
FIG. 18 (A and B) is a cross sectional view showing a process for preparing a porous layer of silicon according to the present invention.
Figure 18B:
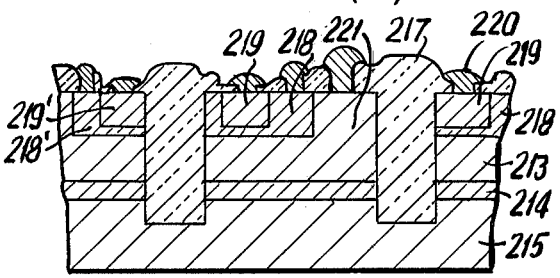

In the process of FIG. 18, a silicon nitride film 212 and an ion-implanted photo-resist or an ion-implanted polyimide film 211 are formed as in the embodiment of FIG. 17 and then anodic reaction takes place in a high concentration of hydrofluoric acid solution, with the double films 212 and 211 used as a protective mask, so that an N type collector layer 213, an N+ buried layer 214, and part of a P type substrate 215 are selectively converted into a porous silicon layer 216, as shown in FIG. 18(A). Then, the ion-implanted photo-resist or ion-implanted polyimide film 211 is removed in an oxygen atmosphere at a high temperature, after which the silicon nitride film 212 is removed with hot phosphoric acid, and then the porous silicon layer 216 is thermally oxidized, so that an isolation region 217 for IC elements is formed by the silicon oxide. Thereafter, a base region 218 and an emitter region 219 are formed within an isolated island portion 221 according to diffusion process or ion-implanting process, thereby providing a transistor, as shown in FIG. 18(B). In this case, since the isolation region 217 consists of a silicon oxide film, the base and emitter regions may be positioned in contact with the isolation region 217, as shown at 218' and 219'. The isolation of the IC elements due to a silicon film improves the compactness of the IC elements and lowers the stray capacitance thereof. Alternatively, after the porous layer 216 has been prepared with the films 211 and 212 used as a protective mask, a P-type impurity may be diffused in the porous layer 216 instead of oxidation of this layer, so that the IC elements may be isulated by a P-N junction.

It is needless to mention that the selective preparation of a porous layer of silicon in a high concentration of a hydrofluoric acid solution by utilizing the protective masks 211, 212 having acid resistance is effective not only in the embodiment of FIG. 18 but also in the selective preparation of a porous layer of silicon on the substrate, or silicon on sapphire or spinel, for various purposes. On the other hand, a protective mask of a double or triple film construction may be used not only in the aforesaid selective preparation of a porous layer but also as a protective mask as used in a solution including a high concentration of a hydrofluoric acid solution, for instance, a nitric-acid-hydrofluoric acid solution, in which silicon is subjected to selective etching.

Thus, although the process according to the invention has been herein specifically described with respect to several embodiments thereof, it will be apparent to those having ordinary skill in the art that modifications may be made thereto, all without necessarily departing from the spirit and scope of the invention.

What is claimed is:

1. A process for preparing a photo- mask comprising the steps of:

forming a substantially transparent organic film on a transparent substrate to a thickness of 300A to 10 μm and in a predetermined pattern, said organic film being comprised of at least one material selected from the group consisting of a photo-resist, polymethyl acrylate, rubber, novolak, polyethylene, polyimide, and epoxy, and implanting in said organic film ions accelerated at an acceleration voltage of at least 50 KeV, to a dose level of at least $10^{14}$/cm$^2$ to such an extent that said organic film has an optical density that is sufficient to shield visible light and/or ultraviolet rays, thereby providing a photo-mask which selectively shields visible light and/or ultraviolet rays in said predetermined pattern.

2. A process for preparing a photo-mask for use in photo-etching, comprising the steps of;

preparing a transparent substrate through which a visible light and/or ultraviolet rays can be transmitted, depositing a substantially transparent photo-resist film on one plane of said substrate to a thickness of 300 A to 10 $\mu$m, selectively removing said photo-resist film to leave a predetermined pattern, and implanting in said remaining photo-resist film ions accelerated at an acceleration voltage of at least 50 KeV, to a dose level of at least $10^{14}/cm^2$ to such an extent that said photo-resist film has an optical density that is sufficient to shield visible light and/or ultraviolet rays, thereby providing a photo-mask which selectively shields visible light and/or ultraviolet rays in said predetermined pattern.

3. A process for preparing a photo-mask comprising the steps of: forming a first light-shielding pattern on one surface of a transparent substrate, depositing a substantially transparent photo-resist film of a thickness of 300A to 10 $\mu$m over the entire surface of said first light-shielding pattern and that portion of said one surface of said transparent substrate on which said first light-shielding pattern is not present, selectively removing said photo-resist film lying on said first light-shielding pattern, implanting in the remaining photo-resist film ions accelerated at an acceleration voltage at least 50 KeV to a dose level of at least $10^{14}/cm^2$ to convert said remaining photo-resist film to a second light-shielding pattern which is negative with respect to said first light-shielding pattern, and thereafter removing said first light-shielding pattern, whereby a photo-mask having the second light-shielding pattern on the transparent substrate is obtained.

4. A process for repairing a photo-mask for use in photo-etching, comprising the steps of:

selectively forming a substantially transparent photo-resist film of a thickness of 300A to 10$\mu$m on a predetermined portion of said photo-mask having a pattern of a light-shielding material on a transparent substrate, and implanting in said photo-resist film ions accelerated at an acceleration voltage of at least 50KeV to a dose level of at least $10^{14}/cm^2$ to such an extent that said photo-resist film has an optical density that is sufficient to shield visible light and/or ultraviolet rays.

5. A photo-mask comprising a substrate of a transparent material and a predetermined pattern of an opaque photo-resist film formed on the surface of said substrate, said photo-resist film having been made opaque by having been implanted with ions accelerated at a voltage of at least 50KeV to a dose level of at least $10^{14}/cm^2$ to such an extent so that said photo-resist film shields visible light and/or ultraviolet rays.

6. A process for preparing a photo-mask for use in photo-etching comprising the steps of preparing a transparent substrate thorugh which a visible light and/or ultraviolet rays can be transmitted, depositing a substantially transparent organic film on an entire surface of said transparent substrate, said organic film being comprised of at least one material selected from the group consisting of a photo-resist, polymethl acrylate, rubber, novolak, polyethyene, polystyrene, polyimide, and epoxy; implanting in said organic film ions accelerated at an acceleration voltage of at least 50KeV, to a dose level of at least $10^{14}/cm^2$ to such an extent that said organic film has an optical density sufficient to shield visible light and/or ultraviolet rays, and selectively removing said ion-implanted organic film to leave a predetermined pattern, thereby providing a photomask which selectively shields visible light and/or ultraviolet rays in said predetermined pattern.

7. A process according to claim 6 wherein said step of selectively removing said ion-implanted organic film includes selectively etching said ion-implanted organic film by plasma etching or sputtering etching.

8. A process for preparing a photo-mask for use in photo-etching comprising the steps of preparing a transparent substrate through which a visible light and/or ultraviolet rays can be transmitted, depositing a substantially transparent photo-resist film on an entire surface of said transparent substrate, implanting in said photo-resist film ions accelerated at an acceleration voltage of at least 50KeV, to a dose level of at least $10^{14}/cm^2$ to such an extent that said photo-resist film has an optical density sufficient to shield visible light and/or ultraviolet rays, and selectively removing said ion-implanted photo-resist film to leave a predetermined pattern, thereby providing a photo-mask which selectively shields visible light and/or ultraviolet rays in said predetermined pattern.

9. A process according to claim 8, wherein said step of selectively removing said ion-implanted photo-resist film includes selectively etching said ion-implanted photo-resist film by plasma etching or sputtering etching.

* * * * *

UNITED STATES PATENT OFFICE
CERTIFICATE OF CORRECTION

Patent No. 4,068,018    Dated January 10, 1978

Inventor(s) Tadahiro Hashimoto et al

It is certified that error appears in the above-identified patent and that said Letters Patent are hereby corrected as shown below:

IN THE ABSTRACT

Line 6, after "predetermined" insert -- acceleration --

Signed and Sealed this

Twenty-fifth Day of April 1978

[SEAL]

Attest:

RUTH C. MASON
Attesting Officer

LUTRELLE F. PARKER
Acting Commissioner of Patents and Trademarks